(12) United States Patent
Choi

(10) Patent No.: US 8,593,863 B2
(45) Date of Patent: Nov. 26, 2013

(54) MAGNETIC RESISTANCE MEMORY APPARATUS HAVING MULTI LEVELS AND METHOD OF DRIVING THE SAME

(75) Inventor: Won Joon Choi, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 38 days.

(21) Appl. No.: 13/244,183

(22) Filed: Sep. 23, 2011

(65) Prior Publication Data
US 2013/0033927 A1  Feb. 7, 2013

(30) Foreign Application Priority Data
Aug. 5, 2011  (KR) .................... 10-2011-0078268

(51) Int. Cl.
*G11C 11/00*  (2006.01)

(52) U.S. Cl.
USPC ............ 365/158; 365/148; 365/171; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 428/810–816, 817–825.1, 826; 977/933–935

See application file for complete search history.

(56) References Cited

U.S. PATENT DOCUMENTS

| | | | | |
|---|---|---|---|---|
| 6,801,451 | B2 * | 10/2004 | Tran et al. | 365/158 |
| 6,985,385 | B2 * | 1/2006 | Nguyen et al. | 365/173 |
| 2004/0042264 | A1 * | 3/2004 | Tran et al. | 365/158 |
| 2004/0065906 | A1 * | 4/2004 | Asao | 257/208 |
| 2005/0045913 | A1 * | 3/2005 | Nguyen et al. | 257/200 |
| 2008/0310219 | A1 | 12/2008 | Chen et al. | |

OTHER PUBLICATIONS

Tomonori Mano et al, "High Bulk Spin Scattering Asymmetry in CPP Spin Valves With Alternated Monatomic [Fe/Co]n Superlattice,"IEEE Transactions on Magnetics, Oct. 2009, pp. 3460-3463, vol. 405, No. 10.
Randall Law et al, "Multistate Storage in Dual Spin Valves with Perpendicular Magnetic Anisotropy," Journal of Applied Physics 105, May 26, 2011, pp. 103911-1-103911-4.

* cited by examiner

*Primary Examiner* — Harry W Byrne
(74) *Attorney, Agent, or Firm* — IP & T Group LLP

(57) ABSTRACT

A magnetic resistance memory apparatus capable of implementing various levels and a method of driving the same are provided. The magnetic resistance memory apparatus includes a first magnetic device that includes a fixed layer having a fixed magnetization direction, a tunnel layer disposed on the fixed layer, and a first free layer disposed on the tunnel layer having a variable magnetization direction, and a second magnetic device disposed on the first magnetic device including a plurality of free layers insulated with a spacer layer interposed.

9 Claims, 5 Drawing Sheets

MAGNETIC RESISTANCE MEMORY APPARATUS HAVING MULTI LEVELS AND METHOD OF DRIVING THE SAME

CROSS-REFERENCES TO RELATED APPLICATION

The present application claims priority under 35 U.S.C. 119(a) to Korean application number 10-2011-0078268, filed on Aug. 5, 2011, in the Korean Patent Office, which is incorporated by reference in its entirety as if set forth in full.

BACKGROUND OF THE INVENTION

1. Technical Field

The present invention relates to a semiconductor integrated circuit device and a method of driving the same, and more particularly, to a magnetic memory apparatus having multi-levels and a method of driving the same.

2. Related Art

Along with high speed and low power consumption, a fast write/read operation and a low operation voltage are also useful characteristics of memory devices embedded in the electronic appliances. Magnetic memory apparatuses have been suggested to satisfy the useful characteristics. Magnetic memory apparatuses have high speed operation and/or non volatile characteristics.

In general, magnetic memory apparatuses may include magnetic tunnel junction patterns (hereinafter, referred to as MTJs). The MTJ may include two magnetic materials and an insulating layer interposed between the two magnetic materials. A resistance of the MTJ is varied based on magnetization directions of the two magnetic materials. More specifically, when the magnetization directions of the two magnetic materials are anti-parallel to each other, the MTJ may have a large resistance, and when the magnetization directions of two magnetic materials are parallel to each other, the MTJ may have a small resistance. Therefore, the MTJ may have different resistances, and it is possible to read/write data according to a resistance difference.

Some magnetic random access memories (MRAM) have created an MTJ device by forming a ferromagnetic tunnel junction as a magnetoresistance device. The MTJ device includes three-layered layer including a magnetic layer, a nonmagnetic layer, and a magnetic layer and current flows to tunnel the nonmagnetic layer (a tunnel barrier layer). Another MTJ device design, called a spin valve structure, contains an antiferromagnetic layer that is disposed adjacent to a magnetic layer, and a magnetization direction is fixed to improve a sensibility of a magnetic field.

In the MRAM, a magnetization state of a ferromagnetic material forming a unit cell may be changed by a magnetic field. Alternatively, there are current-induced magnetoresistance devices where a magnetization state of a ferromagnetic material is changed by applying a current. The current-induced magnetoresistance devices are devices that control a magnetization direction by applying current to a magnetic layer to control a magnetization direction of the magnetic layer.

A method of reading information from the current-induced magnetoresistance device is similar to a magnetic-induced MTJ or giant magnetoresistance (GMR) devices. When a relative magnetization direction of a free magnetic layer and a fixed magnetic layer is parallel, the device has a low resistance. On the other hand, when a relative magnetization direction of the free magnetic layer and a fixed magnetic layer is anti-parallel, the device has a high resistance. Therefore, the resistance states of the device may correspond to digital values "0" and "1".

Currently, a dual GMR structure has been suggested to obtain multi-levels other than "0" and "1" (J. Appl. Phys. 105, 103911, 2009).

As shown in FIG. 1, the dual GMR structure includes a first fixed layer 10, a first spacer layer 20, a free layer 30, a second spacer layer 40, and a second fixed layer 50. The first and second fixed layers 10 and 50 may include a ferromagnetic material having a fixed magnetism. The free layer 30 may be an antiferromagnetic material having a magnetism that varies according to an external magnetic field. The first and second spacer layers 20 and 40 may be formed of a CoFe/Cu/Co material.

When the magnetism of the first and second fixed layers 10 and 50 and the free layer 30 are changed to implement multi-levels, the dual GMR can implement only three levels, (0,0), (0,1) and (1,0), as shown in FIG. 2.

Therefore, a magnetic resistance memory apparatus capable of implementing more various levels is desired.

SUMMARY

The present invention provides a magnetic resistance memory apparatus capable of implementing various levels and a method of driving the same.

According to an aspect of an exemplary embodiment, a magnetic resistance memory apparatus includes a first magnetic device that includes a fixed layer having a fixed magnetization direction, a tunnel layer disposed on the fixed layer, and a first free layer disposed on the tunnel layer having a variable magnetization direction, and a second magnetic device disposed on the first magnetic device including a plurality of free layers insulated with a spacer layer interposed.

According to another aspect of an exemplary embodiment, a magnetic resistance memory apparatus includes a first magnetic device that includes a first free layer having a variable magnetization direction, a tunnel layer disposed on the first free layer, and a fixed layer disposed on the tunnel layer and having a fixed magnetization direction and a second magnetic device disposed below the first magnetic device including a plurality of free layers insulated with a spacer layer being interposed. The fixed layer, the first free layer, and the plurality of free layers are configured to increase in coercive force toward the fixed layer.

According to still another aspect of an exemplary embodiment, a magnetic resistance memory apparatus includes a fixed layer having a fixed first magnetization direction, a tunnel layer formed on the fixed layer, a first free layer formed on the tunnel layer and having the first magnetization direction or a second magnetization direction anti-parallel to the first magnetization direction, a first spacer layer disposed on the first free layer, a second free layer disposed on the first spacer layer and having the first magnetization direction or the second magnetization direction, a second spacer layer disposed on the second free layer, and a third free layer disposed on the second spacer layer and having the first or second magnetization direction. The fixed layer and the first through third free layers are formed to increase in coercive force that maintains the magnetization direction of the free layers toward the fixed layer.

According to yet another aspect of an exemplary embodiment, a method of driving a magnetic resistance memory includes setting first through third free layers to have a second magnetization direction so that the magnetic memory apparatus has a first resistance level, changing the magnetization direction of a third free layer to the first magnetization direction by applying a first magnetic field so that the magnetic memory apparatus has a second resistance level, changing the magnetization direction of a second free layer to the first magnetization direction by applying a second magnetic field so that the magnetic memory apparatus has a third resistance level, and changing the magnetization direction of a first free layer to the first magnetization direction by applying a third magnetic field to have a fourth resistance level.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 4A and 4B are cross-sectional views showing magnetization directions for each magnetic field of a multi-layered magnetic resistance memory apparatus of FIG. 3, wherein FIG. 4A is a schematic diagram illustrating a resistance variable mechanism where a fixed layer and free layers have the same in-plane magnetic anisotropy and FIG. 4B is a schematic diagram illustrating a resistance variable mechanism where a fixed layer and free layers have the same out-of-plane magnetic anisotropy;

DESCRIPTION OF EXEMPLARY EMBODIMENT

Figure 1:
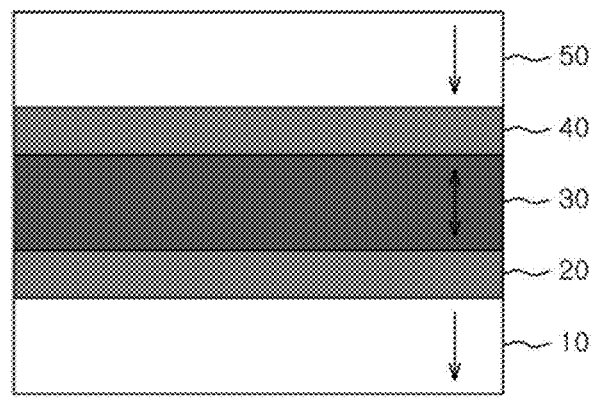
FIG. 1 is a cross-sectional view illustrating a dual giant magneto resistance (GMR) device in the related art.
Figure 2:
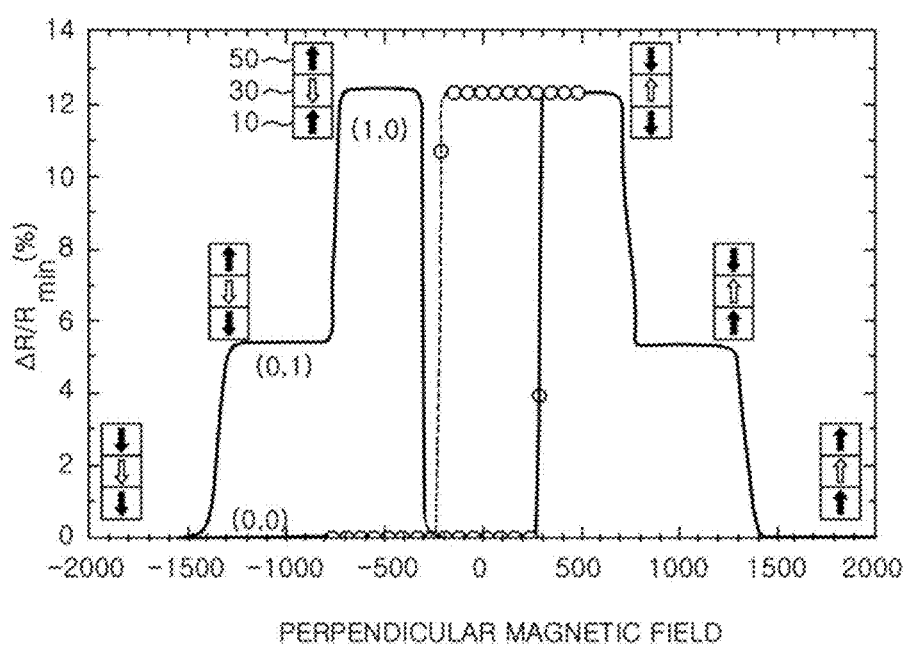
FIG. 2 is a graph illustrating a resistance level for each magnetic field of a dual GMR in the related art.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 3:
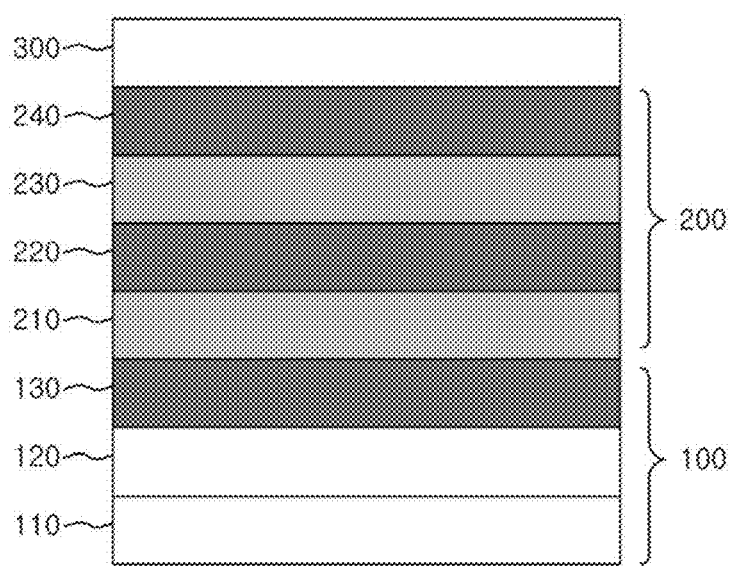
FIG. 3 is a cross-sectional view illustrating a multi-layered magnetic resistance memory apparatus according to an exemplary embodiment.

Referring to FIG. 3, the magnetic resistance memory apparatus according to an exemplary embodiment may include a first magnetic device 100 and a second magnetic device 200 forming a stacking structure.

The first magnetic device 100 may be a magnetic tunnel junction (MTJ) that includes a fixed layer 110, a tunnel layer 120, and a first free layer 130. The fixed layer 110 may be a ferromagnetic material layer with a fixed magnetization direction. The tunnel layer 120 may be an insulating layer that includes one or more of the following materials: magnesium oxide (MgO), aluminum oxide ($Al_2O_3$), hafnium oxide ($HfO_2$), titanium oxide ($TiO_2$), yttrium oxide ($Y_2O_3$), and ytterbium oxide ($Yb_2O_3$). The first free layer 130 may be formed of a material with a reversible magnetization direction in response to an applied magnetic field.

The second magnetic device 200 may be a GMR device that includes a first spacer layer 210, a second free layer 220, a second spacer layer 230, and a third free layer 240 that are sequentially stacked. The GMR device may include a spin valve layer including a fixing magnetization layer, a free layer capable of changing a magnetization direction in response to an external magnetic field, and a spacer layer includes a nonmagnetic conductive layer. In the exemplary embodiment, the GMR device is formed on the first magnetic device 100 so that the spin valve layer may be the first magnetic device 100.

The first and second spacer layers 210 and 230 may include of the nonmagnetic conductive material, for example, a material includes one or more of the following materials: copper (Cu), cobalt iron (CoFe), and cobalt (Co). The first spacer layer 210 functions to insulate the first magnetic device 100 and the layers above the first spacer layer 210 in the second magnetic device 200. The second spacer layer 230 functions to insulate the second and third free layers 220 and 240. The second and third free layers 220 and 240 are materials capable of reversing magnetization directions in response to a magnetic field. In the exemplary embodiment, the third free layer 240 has a higher coercive force (Hc) than the second free layer 220, and the second free layer 220 has a higher coercive force than the first free layer 130. Then, the resistance differences are between the fixed layer 110 and the first free layer 130, between the first free layer 130 and the second free layer 220, between the second free layer 220 and the third free layer 230, and between the third free layer 240 and the fixed layer 110.

A capping layer 300 may be further formed on the third free layer 240 to connect with external devices. The capping layer 300 includes, for example, a conductive layer such as Ti or tantalum (Ta).

Figure 4A:
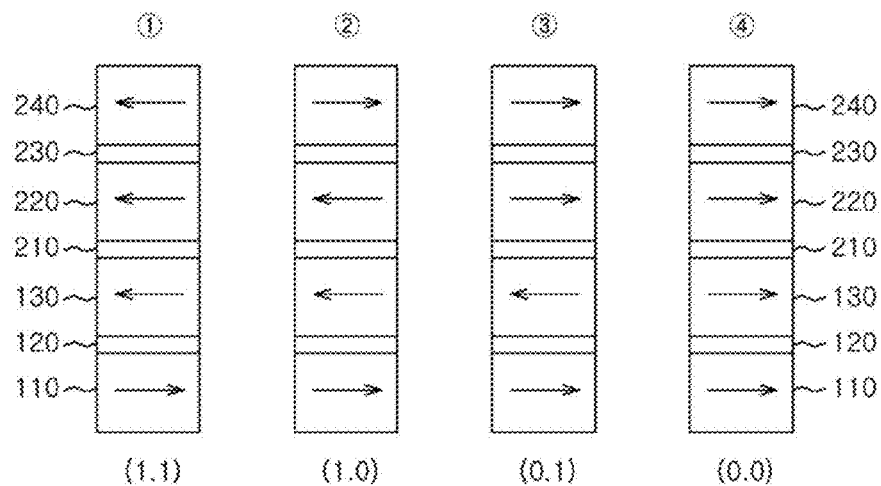
Figure 5:
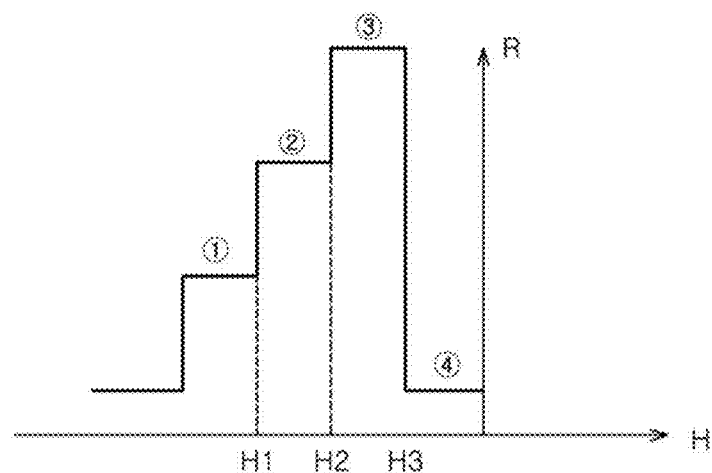
FIG. 5 is a graph illustrating resistance levels for each magnetic field of the multi-layered magnetic resistance memory apparatus of FIG. 3.

Referring to FIGS. 4A and 5, in the magnetic resistance memory apparatus, the fixed layer 110 and the first through third free layers 130, 220, and 240 are formed so that the magnetization direction of the fixed layer is fixed in the direction of a first magnetization direction, and the first through third free layers 130, 220, and 240 may have a second magnetization direction anti-parallel to the first magnetization direction. In FIG. 5, an X-axis denotes a magnetic field and a Y-axis denotes a resistance. The first through third free layers 130, 220, and 240 are formed to have the same second magnetization direction. Since the first through third free layers 130, 220, and 240 have the same second magnetization direction, the first through third free layers 130, 220, and 240 behave like a single magnetic layer. The fixed layer 110 and the first through third free layers 130, 220, and 240 have anti-parallel magnetization directions. The anti-parallel magnetization directions of the fixed layer and the first through third free layers 130, 220, and 240 means that the magnetic resistance memory has a first resistance state (①).

When, for example, a first magnetic field (H1) that is sufficient is applied to reverse the magnetization direction of the third free layer 240, the magnetization direction of the third free layer 240 is changed. Since the coercive force of the third free layer 240 is the smallest, only the magnetization direction of the third free layer 240 is changed. Thereby, the magnetization direction of the third free layer 240 is reversed to match the first magnetization direction. When only the magnetic direction of the third free layer is parallel to the first magnetization direction, the magnetic resistance memory has a second resistance state (②) having a larger resistance than the first resistance state (①).

Next, when, for example, a second magnetic field (H2) that is larger than the first magnetic field (H1) that is sufficient is applied to reverse the magnetization direction of the second free layer 220, the magnetization direction of the second free layer 220 is changed. The magnetization direction of the second free layer 220 and the magnetization direction of the third free layer 240 are changed to be parallel with the first magnetization direction. Therefore, the magnetic resistance memory has a third resistance state (③), a state that has a higher resistance level than the second resistance state (②).

Finally, when, for example, a third magnetic field (H3) larger than the second magnetic field (H2) that is sufficient is applied to reverse the magnetization direction of the first free layer 130, the magnetization directions of the first through third free layers 130, 220, and 240 are changed to the first magnetization direction. When the first through third free layers 130, 220, and 240 all have the first magnetization direction, the magnetic resistance memory has a fourth resistance state (④). The fixed layer 110 and the first through third free layers 130, 220, and 240 all have the same magnetization direction in the fourth resistance state (④), so the fourth resistance state (④) has the lowest resistance state.

As described above, the magnetic resistance memory apparatus in the exemplary embodiment can implement four different resistance levels by changing a magnetic field. The four resistance levels can implement 2-bit multi-levels.

Figure 4B:
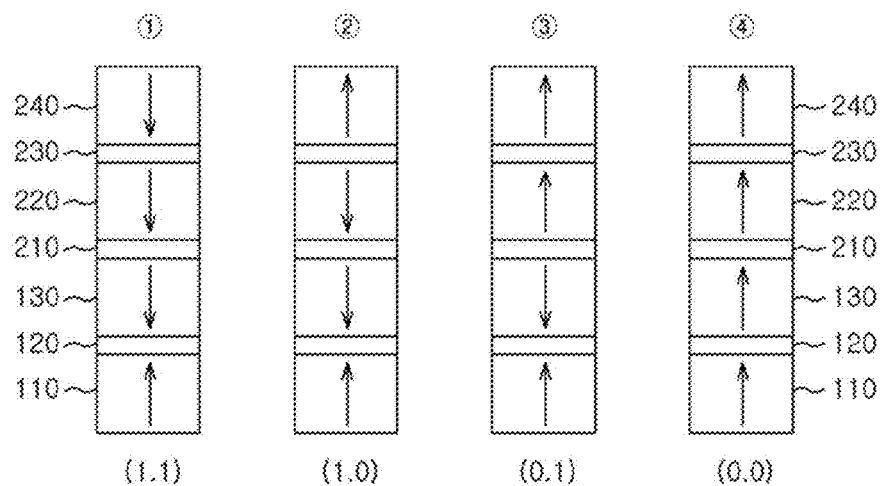

FIG. 4A is a schematic diagram showing a magnetic resistance memory apparatus where the fixed layer and the free layers have an in-plane magnetic anisotropy to a surface of the fixed layer, and FIG. 4B is a schematic diagram showing a magnetic resistance memory apparatus where the fixed layer and the free layers have an out-of-plane magnetic anisotropy to a surface of the fixed layer.

Figure 6:
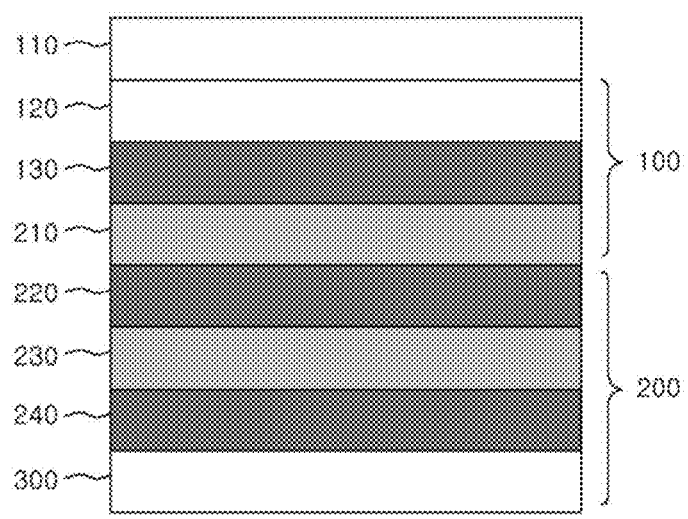
FIGS. 6 and 7 are cross-sectional views of multi-layered magnetic resistance memory apparatuses according to other exemplary embodiments.

FIG. 6 illustrates the case where a first magnetic device 100 forming an MTJ is stacked on a second magnetic device 200 forming a GMR device. Similar to the embodiment discussed above, the magnetic resistance memory apparatus can implement multi-levels by changing a magnetic field although the first magnetic device 100 is stacked on the second magnetic device 200.

Figure 7:
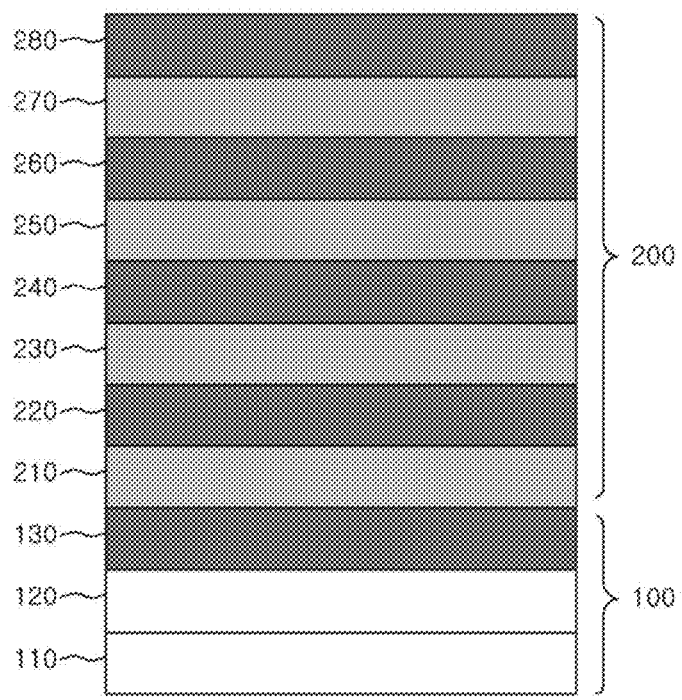

The present invention is not limited to the above-described exemplary embodiments having two free layers 220 and 240 as the second magnetic device. As shown in FIG. 7, three or more free layers 260 and 280 may be further stacked with spacer layers 250 and 270 being interposed to forming a GMR device. In this case, a magnetic field is stepwise controlled in four or more steps to implement 2-bit levels or more multi-bits levels.

As described above, a first magnetic device forming an MTJ and a second magnetic device forming a GMR device are stacked, and a magnetic field is stepwise applied to sequentially reverse a magnetization direction of a free layer of the MTJ device and free layers of the GMR device, thereby implementing multi-levels. Since the MTJ device includes a fixed layer and, for example, only the magnetization directions of the free layers of the MTJ and GMR devices are reversed, multi-levels can be implemented by a low critical current density (Jc). Further, multi-levels can be implemented by a single MTJ, thereby capable of being applied in high integration devices.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A magnetic resistance memory apparatus, comprising:
   a first magnetic device that includes a fixed layer having a fixed magnetization direction, a tunnel layer disposed on the fixed layer, and a first free layer disposed on the tunnel layer having a variable magnetization direction; and
   a second magnetic device disposed on the first magnetic device, the second magnetic device including a plurality of spacer layers alternately stacked with a plurality of free layers,
   wherein a lowest spacer layer, of the plurality of spacer layers, is directly disposed on the first free layer.

2. The magnetic resistance memory apparatus of claim 1, wherein the fixed layer, the first free layer, and the plurality of free layers are configured to increase in coercive force toward the fixed layer.

3. The magnetic resistance memory apparatus of claim 1, wherein the fixed layer, the first free layer, and the plurality of free layers have an in-plane magnetic anisotropy, respectively.

4. The magnetic resistance memory apparatus of claim 1, wherein the fixed layer, the first free layer, and the plurality of free layers have an out-of-plane magnetic anisotropy, respectively.

5. The magnetic resistance memory apparatus of claim 2, wherein the first free layer and the plurality of free layers are capable of changing magnetization direction based on the presence of an applied magnetic field of a sufficient coercive force.

6. The magnetic resistance memory apparatus of claim 1, wherein the tunnel layer is an insulating layer.

7. The magnetic resistance memory apparatus of claim 1, wherein, the fixed layer includes a ferromagnetic material.

8. The magnetic resistance memory apparatus of claim 1, wherein, the first magnetic device forms a spin valve layer.

9. The magnetic resistance memory apparatus of claim 1, wherein, the spacer layer includes a nonmagnetic conductive material.

* * * * *